United States Patent
Yang et al.

(10) Patent No.: US 12,334,878 B2
(45) Date of Patent: Jun. 17, 2025

(54) ELECTRONIC DEVICE AND METHOD INCLUDING POWER AMPLIFIER MODULE HAVING PROTECTION CIRCUIT

(71) Applicant: SAMSUNG ELECTRONICS CO., LTD., Suwon-si (KR)

(72) Inventors: Jaejin Yang, Suwon-si (KR); Hyoseok Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 429 days.

(21) Appl. No.: 17/969,302

(22) Filed: Oct. 19, 2022

(65) Prior Publication Data

US 2023/0163730 A1 May 25, 2023

Related U.S. Application Data

(63) Continuation of application No. PCT/KR2022/013484, filed on Sep. 7, 2022.

(30) Foreign Application Priority Data

Nov. 22, 2021 (KR) .......................... 10-2021-0161796

(51) Int. Cl.
*H04B 1/04* (2006.01)
*H03F 1/52* (2006.01)
(Continued)

(52) U.S. Cl.
CPC ................. *H03F 1/52* (2013.01); *H03F 1/56* (2013.01); *H03F 3/245* (2013.01); *H04B 1/0458* (2013.01);
(Continued)

(58) Field of Classification Search
CPC .................... H04B 1/0458; H04B 1/04; H04B 2001/0408; H04B 2001/0416; H03F 1/52; H03F 1/56; H03F 3/245
See application file for complete search history.

(56) References Cited

U.S. PATENT DOCUMENTS 7,480,345 B2 * 1/2009 Kurakami ........... H03F 3/45085
375/297
8,076,974 B2 12/2011 Tanaka et al.
(Continued)

FOREIGN PATENT DOCUMENTS

EP 3379724 9/2018
JP 2009-284034 12/2009
(Continued)

OTHER PUBLICATIONS

Search Report and Written Opinion dated Dec. 21, 2022 issued in International Patent Application No. PCT/KR2022/013484.

*Primary Examiner* — Tuan Pham
(74) *Attorney, Agent, or Firm* — Nixon & Vanderhye, P.C.

(57) ABSTRACT

An electronic device includes: an antenna, a PAM including a PA configured to amplify a transmitting signal and a protection circuit, a PMIC configured to supply voltage to the PA, and at least one processor is configured to: provide a first signal, to a NAND gate in the protection circuit, provide to a AND gate in the protection circuit, a second signal indicating a result of a logical operation between the first signal and a bias enable signal for the PA, provide to the AND gate, a third signal indicating whether the transmitting signal is input to the PAM, provide to a switching circuit, a fourth signal indicating a result of logical operation between the second signal and the third signal, identify whether to apply a bias voltage to the PA based on the fourth signal, and
(Continued)

transmit the transmitting signal, to the external electronic device, via the antenna.

20 Claims, 10 Drawing Sheets

(51) Int. Cl.
*H03F 1/56* (2006.01)
*H03F 3/24* (2006.01)
*H03K 19/20* (2006.01)

(52) U.S. Cl.
CPC .. *H03F 2200/426* (2013.01); *H03F 2200/451* (2013.01); *H03K 19/20* (2013.01)

(56) References Cited

U.S. PATENT DOCUMENTS

| | | | |
|---|---|---|---|
| 8,780,515 | B2 | 7/2014 | Chien et al. |
| 9,030,259 | B2 * | 5/2015 | Fisher ................. H03F 3/21 330/288 |
| 9,559,639 | B2 | 1/2017 | Su et al. |
| 11,476,806 | B2 * | 10/2022 | Ng ................. H02M 3/157 |
| 2005/0059362 | A1 | 3/2005 | Kalajo et al. |
| 2007/0053128 | A1 | 3/2007 | Mizushima et al. |
| 2017/0026008 | A1 | 1/2017 | Hong et al. |
| 2021/0194438 | A1 | 6/2021 | Na et al. |
| 2022/0116060 | A1 | 4/2022 | Choi et al. |
| 2022/0337200 | A1 | 10/2022 | Na et al. |

FOREIGN PATENT DOCUMENTS

| | | |
|---|---|---|
| JP | 5479594 | 4/2014 |
| KR | 10-2017-0010553 | 2/2017 |
| KR | 10-2020-0114745 | 10/2020 |
| KR | 10-2021-0051388 | 5/2021 |
| KR | 10-2021-0078965 | 6/2021 |
| WO | 2016/042689 | 3/2016 |

* cited by examiner

| COMPARATOR OUTPUT | 0 | | 1 | | | |
|---|---|---|---|---|---|---|
| NAND#1 OUTPUT (BIAS ENB OR NOT) | 1 | | 1 | | 0 | |
| PEAK DETECT OUTPUT (INPUT OR NOT) | 0 | 1 | 0 | 1 | 0 | 1 |
| AND#1 OUTPUT | 0 | 1 | 0 | 1 | 0 | 0 |
| PA BIAS | BIASING | GND | BIASING | GND | BIASING | BIASING |
| POWER AMP OPERATE OR NOT | ON | OFF | ON | OFF | ON | ON |
| BURNOUT OR NOT | X | X | X | X | X | X |

FIG. 5

| COMPARATOR OUTPUT | 0 | | 1 | | | | | |
|---|---|---|---|---|---|---|---|---|
| AND#1 OUTPUT (ASM/BSW ENB) | 0 (Don't Care) | | 1 (ENB YES) | | | | 0 (ENB NO) | |
| NAND#1 OUTPUT (BIAS ENB OR NOT) | 1 (Don't Care) | | 1 (ENB NO) | | 0 (ENB YES) | | 1 (Don't Care) | |
| PEAK DETECT OUTPUT (INPUT OR NOT) | 0 | 1 | 0 | 1 | 0 | 1 | 0 | 1 |
| AND#2 OUTPUT | 0 | 1 | 0 | 1 | 0 | | 0 | 1 |
| PA BIAS | BIAS | GND | BIAS | GND | BIAS | | BIASING | BIASING |
| POWER AMP OPERATE OR NOT | ON | OFF | ON | OFF | ON | | ON | OFF |
| BURNOUT OR NOT | X | X | X | X | X | X | X | X |

FIG. 7 form of radiation via an antenna pass through an internal wiring of a PCB via a power amplifier (PA), a band selection switch (BSW), a band pass filter (BPF), and an antenna switch module (ASM).
ELECTRONIC DEVICE AND METHOD INCLUDING POWER AMPLIFIER MODULE HAVING PROTECTION CIRCUIT

CROSS-REFERENCE TO RELATED APPLICATIONS

This application is a continuation of International Application No. PCT/KR2022/013484 designating the United States, filed on Sep. 7, 2022, in the Korean Intellectual Property Receiving Office and claiming priority to Korean Patent Application No. 10-2021-0161796, filed on Nov. 22, 2021, in the Korean Intellectual Property Office, the disclosures of which are incorporated by reference herein in their entireties.

BACKGROUND

Field

The disclosure relates to an electronic device and a method including a power amplifier module (PAM) having a protection circuit.

Description of Related Art

An electronic device may include a radio frequency front end (RFFE) including a duplexer for supporting bi-directional communication via a single path. For example, the electronic device may output a transmitting signal in the form of radiation via an antenna pass through an internal wiring of a PCB via a power amplifier (PA), a band selection switch (BSW), a band pass filter (BPF), and an antenna switch module (ASM).

A power amplifier (PA) for amplifying the transmitting signal may reduce the possibility of burnout of the PA when a transmitting signal is applied in a state in which bias enable of the PA, application of target voltage, and normal setting of band selection switch (BSW) and antenna switch module (ASM) are completed.

In general, the setting is controlled via a logic circuit inside the PA, and abnormal operation of the logic circuit may cause various problems including burnout of the PA and burnout of various radio frequency front (RFFE) components. Accordingly, the need for a protection circuit for preventing the PA from burning is increasing.

SUMMARY

According to an example embodiment, an electronic device may comprise: an antenna; a power amplifier module (PAM) connected to the antenna, and including a power amplifier (PA) configured to amplify a transmitting signal for being transmitted to an external electronic device, and a protection circuit; a power management integrated circuit (PMIC) configured to supply voltage to the PA; and at least one processor, wherein the at least one processor may be configured to: via a comparator in the protection circuit, provide a first signal to a NAND gate in the protection circuit, in response to identifying that the supply voltage provided from the PMIC to the PA reaches a target voltage corresponding to a transmitting voltage of the transmitting signal; via the NAND gate, provide, to a AND gate in the protection circuit, a second signal indicating a result of a logical operation between the first signal and a bias enable signal for the PA; via a peak detector in the protection circuit, provide, to the AND gate, a third signal indicating whether the transmitting signal is input to the PAM; via the AND gate, provide, to a switching circuit, a fourth signal indicating a result of logical operation between the second signal and the third signal; via the switching circuit in the protection circuit, identify whether to apply a bias voltage to the PA, based on the fourth signal; and using the PA to which the bias voltage is applied to, transmit the transmitting signal, to the external electronic device, via the antenna.

According to an example embodiment, an electronic device may comprise: an antenna; a power amplifier module (PAM) connected to the antenna, and including a driving amplifier (DA) and a power amplifier (PA) configured to amplify a transmitting signal for being transmitted to an external electronic device, and a protection circuit; a power management integrated circuit (PMIC) configured to provide a supply voltage to the DA and the PA; and at least one processor, wherein the at least one processor may be configured to: via a comparator in the protection circuit, provide a first signal, to a first AND gate in the protection circuit, in response to identifying that the supply voltage provided from the PMIC to the DA and the PA reaches a target voltage corresponding to a transmitting voltage of the transmitting signal; via the first AND gate, provide, to a NAND gate in the protection circuit, a second signal indicating a result of a logical operation between the first signal and at least one enable signal for selecting a frequency band of the transmitting signal, via the NAND gate, provide, to a second AND gate in the protection circuit, a third signal indicating a result of a logical operation between the second signal and a bias enable signal for the DA and the PA; via a peak detector in the protection circuit, provide, to the second AND gate, a fourth signal indicating whether the transmitting signal is input to the PAM; via the second AND gate, provide, to a switching circuit, a fifth signal indicating a result of logical operation between the third signal and the fourth signal; via the switching circuit in the protection circuit, identify whether to apply a bias voltage to the DA, based on the fifth signal, and using the DA and the PA which the bias voltage is applied to, transmit the transmitting signal, to the external electronic device, via the antenna.

The effects that can be obtained from the present disclosure are not limited to those described above, and any other effects not mentioned herein will be clearly understood by those having ordinary knowledge in the art to which the present disclosure belongs, from the following description.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 5 is a diagram illustrating an example of a logic table capable of determining whether a PA is in burnout according to an embodiment;

FIG. 7 is a diagram illustrating an example of a logic table capable of determining whether a PA is in burnout according to an embodiment;

DETAILED DESCRIPTION

According to an example embodiment, an electronic device including a power amplifier module (PAM) having a protection circuit can prevent and/or reduce burnout of a power amplifier (PA) caused by amplifying a signal before internal logic control for amplifying a transmitting signal is completed.

Figure 1:
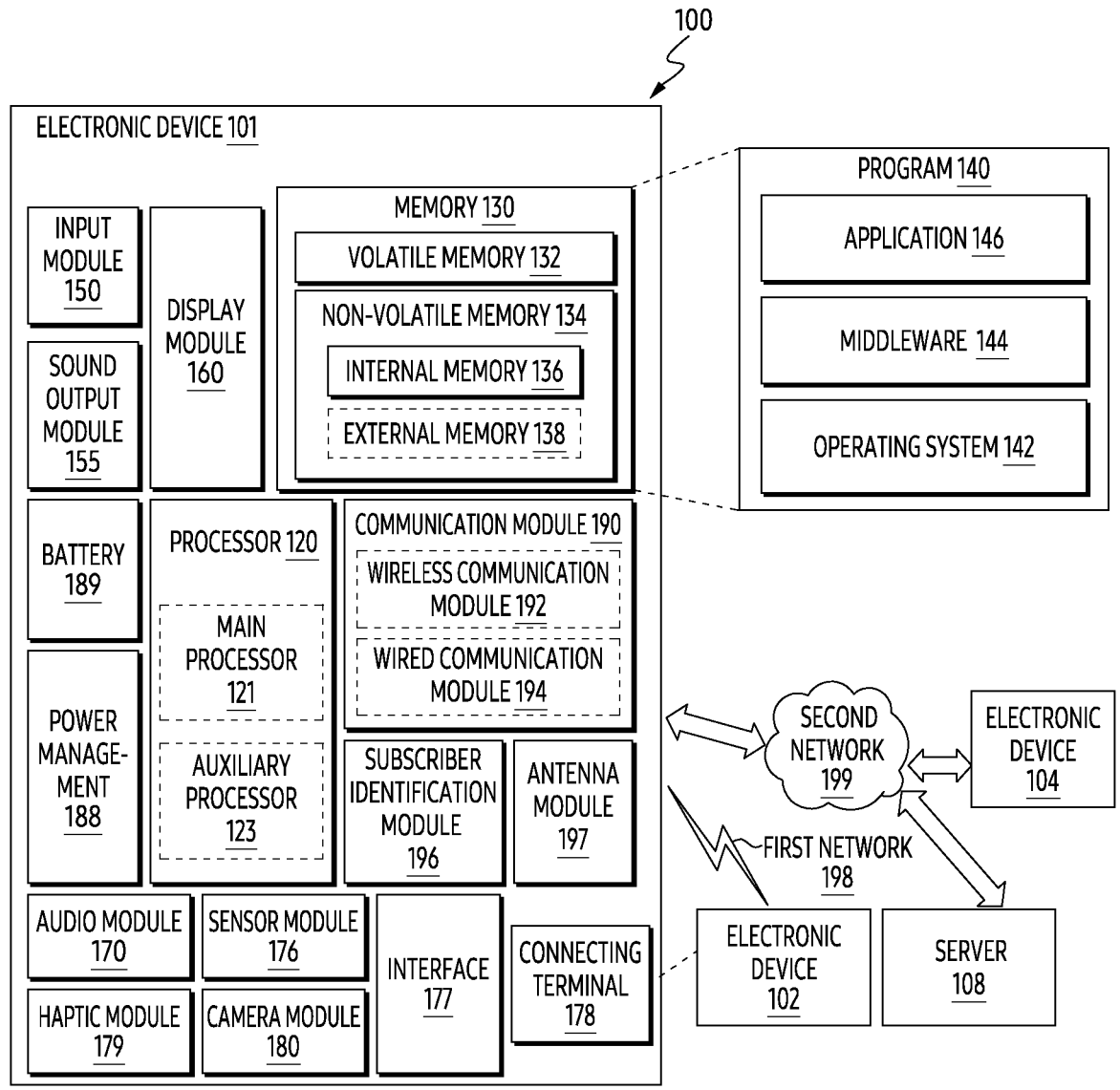
FIG. 1 is a block diagram illustrating an example electronic device in a network environment according to an embodiment.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164*d*B or less) for implementing mMTC, or U-plane latency (e.g., 0.5*ms* or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
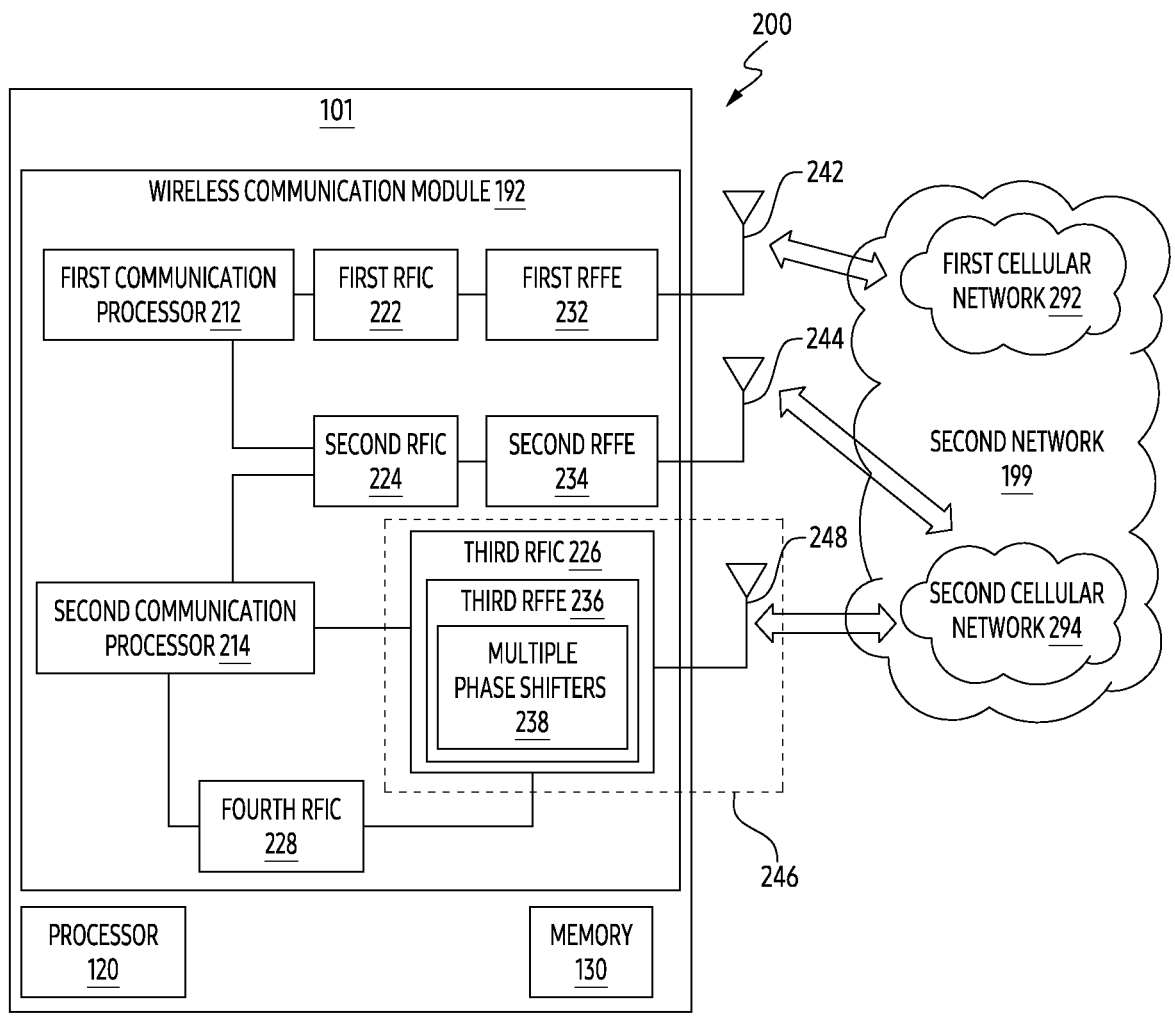
FIG. 2 is a block diagram illustrating an example configuration of an electronic device for supporting legacy network communication and 5G network communication according to an embodiment.

FIG. 2 is a block diagram 200 illustrating an example configuration of the electronic device for supporting legacy network communication and 5G network communication, according to various embodiments.

Referring to FIG. 2, the electronic device 101 may include a first communication processor 212, a second communication processor 214, a first radio frequency integrated circuit (RFIC) 222, a second RFIC 224, and a third RFIC 226, a fourth RFIC 228, a first radio frequency front end (RFFE) 232, a second RFFE 234, a first antenna module 242, a second antenna module 244, and an antenna 248. The electronic device 101 may further include the processor 120 and the memory 130. The second network 199 may include a first cellular network 292 and a second cellular network 294. According to another embodiment, the electronic device 101 may further include at least one of the components illustrated in FIG. 1, and the second network 199 may further include at least one other network. According to an embodiment, the first communication processor 212, the second communication processor 214, the first RFIC 222, the second RFIC 224, the fourth RFIC 228, the first RFFE 232, and the second RFFE 234 may include at least a part of a wireless communication module 192. According to an embodiment, the fourth RFIC 228 may be omitted or may be included as a part of the third RFIC 226.

The first communication processor 212 may support the establishment of a communication channel of a band to be used for wireless communication with the first cellular network 292 and legacy network communication through the established communication channel According to various embodiments, the first cellular network 292 may be a legacy network including a 2nd generation (2G), 3rd generation (3G), 4th generation (4G), and/or long-term evolution (LTE) network. The second communication processor 214 may support the establishment of a communication channel corresponding to a specified band (e.g., approximately 6 GHz to 60 GHz) among bands to be used for wireless communication with the second cellular network 294, and 5G network communication through the established communication channel According to various embodiments, the second cellular network 294 may be a 5G network defined by 3GPP. Additionally, according to an embodiment, the first communication processor 212 or the second communication processor 214 may support the establishment of a communication channel corresponding to another specified band (e.g., approximately 6 GHz or less) among bands to be used for wireless communication with the second cellular network 294, and 5G network communication through the established communication channel According to an embodiment, the first communication processor 212 and the second communication processor 214 may be implemented in a single chip or a single package. According to various embodiments, the first communication processor 212 or the second communication processor 214 may be formed with the processor 120, the coprocessor 123 of FIG. 1, or the communication module 190 in a single chip or a single package.

Upon transmission, the first RFIC 222 may convert a baseband signal generated by the first communication processor 212 into a radio frequency (RF) signal of approximately 700 MHz to approximately 3 GHz used in the first cellular network 292 (e.g., a legacy network). Upon reception, an RF signal may be obtained from the first cellular network 292 (e.g., a legacy network) through an antenna (e.g., the first antenna module 242), and may be preprocessed through an RFFE (e.g., the first RFFE 232). The first RFIC 222 may convert the preprocessed RF signal into a baseband signal so as to be processed by the first communication processor 212.

Upon transmission, the second RFIC 224 may convert a baseband signal generated by the first communication processor 212 or the second communication processor 214 into an RF signal (hereinafter, referred to as a 5G Sub6 RF signal) of the Sub6 band (e.g., approximately 6 GHz or less) used in the second cellular network 294 (e.g., the 5G network). Upon reception, a 5G Sub6 RF signal may be obtained from the second cellular network 294 (e.g., the 5G network) through an antenna (e.g., the second antenna module 244), and may be preprocessed through an RFFE, (e.g., the second RFFE 234). The second RFIC 224 may convert the preprocessed 5G Sub6 RF signal into a baseband signal so as to be processed by a corresponding one of the first communication processor 212 or the second communication processor 214.

The third RFIC 226 may convert a baseband signal generated by the second communication processor 214 into an RF signal (hereinafter, referred to as a 5G Above6 RF signal) of the 5G Above6 band (e.g., approximately 6 GHz to approximately 60 GHz) to be used in the second cellular network 294 (e.g., the 5G network). Upon reception, a 5G Above6 RF signal may be obtained from the second cellular network 294 (e.g., the 5G network) through an antenna (e.g., the antenna 248), and may be preprocessed through the third RFFE, 226. For example, the third RFFE, 226 may perform preprocessing of the signal by using a phase shifter 238. The third RFIC 226 may convert the preprocessed 5G Above6 RF signal into a baseband signal so as to be processed by the second communication processor 214. According to an embodiment, the third RFFE, 226 may be formed as a part of the third RFIC 226.

According to an embodiment, the electronic device 101 may include the fourth RFIC 228 separately from or at least as a part of the third RFIC 226. In this case, the fourth RFIC 228 may convert the baseband signal generated by the second communication processor 214 into an RF signal (hereinafter, referred to as an intermediate frequency (IF) signal) of an intermediate frequency band (e.g., approximately 9 GHz to approximately 11 GHz), and then transmit the IF signal to the third RFIC 226. The third RFIC 226 may convert the IF signal into a 5G Above6 RF signal. Upon reception, a 5G Above6 RF signal may be received from the second cellular network 294 (e.g., the 5G network) through an antenna (e.g., the antenna 248), and may be converted into an IF signal by the third RFIC 226. The fourth RFIC 228 may convert the IF signal into the baseband signal so as to be processed by the second communication processor 214.

According to an embodiment, the first RFIC 222 and the second RFIC 224 may be implemented as a single chip or at least a part of a single package. According to an embodiment, the first RFFE 232 and the second RFFE 234 may be implemented as a single chip or at least a part of a single package. According to an embodiment, at least one of the first antenna module 242 or the second antenna module 244 may be omitted or combined with another antenna module to process RF signals of a plurality of corresponding bands.

According to an embodiment, the third RFIC 226 and the antenna 248 may be disposed on the same substrate to form a third antenna module 246. For example, the wireless communication module 192 or the processor 120 may be disposed on a first substrate (e.g., a main PCB). In this case, the third RFIC 226 may be disposed in a partial region (e.g., the lower surface) of a second substrate (e.g., a sub PCB) separate from the first substrate, and the antenna 248 may be disposed in another partial region (e.g., the upper surface) to form the third antenna module 246. According to an embodiment, the antenna 248 may include, for example, an antenna array that may be used for beamforming. By disposing the third RFIC 226 and the antenna 248 on the same substrate, it is possible to reduce the length of the transmission line therebetween. This, for example, may reduce the loss (e.g., attenuation) of a signal in a high frequency band (e.g., approximately 6 GHz to approximately 60 GHz) used for 5G network communication by the transmission line. Accordingly, the electronic device 101 may improve the quality or speed of communication with the second cellular network 294 (e.g., the 5G network).

The second cellular network 294 (e.g., the 5G network) may be operated independently of (e.g., Stand-Alone (SA)) or operated to be connected to (e.g., Non-Stand Alone (NSA)) the first cellular network 292 (e.g., the legacy network). For example, in the 5G network, there may be only an access network (e.g., 5G radio access network (RAN) or next-generation RAN (NG RAN)) and no core network (e.g., next-generation core (NGC)). In this case, after accessing the access network of the 5G network, the electronic device 101 may access an external network (e.g., the Internet) under the control of a core network (e.g., evolved packed core (EPC)) of the legacy network. Protocol information for communication with the legacy network (e.g., LTE protocol information) or protocol information for communication with the 5G network (e.g., New Radio (NR) protocol information) may be stored in the memory 230 and may be accessed by other components (e.g., the processor 120, the first communication processor 212, or the second communication processor 214).

Figure 3:
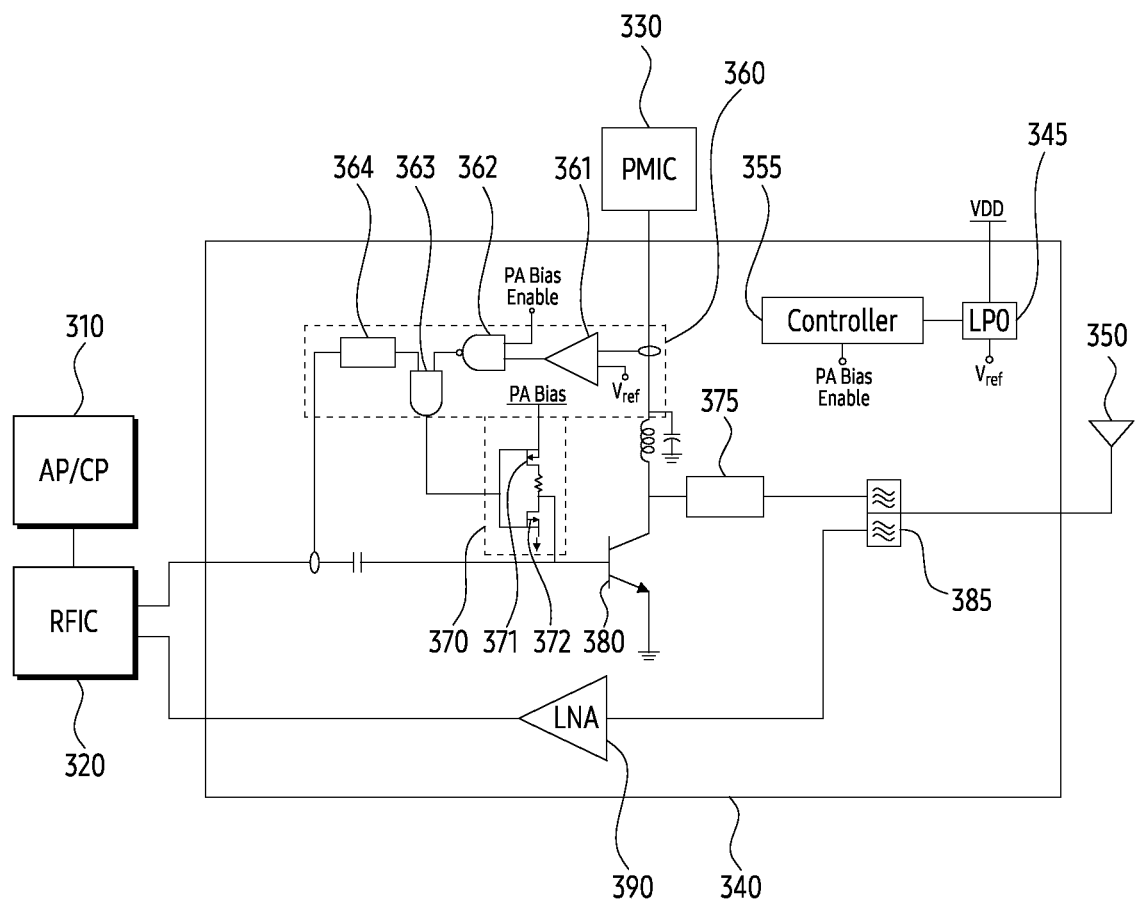
FIG. 3 is a block and circuit diagram illustrating an example configuration of an electronic device according to an embodiment.

FIG. 3 is a block and circuit diagram illustrating an example configuration of an electronic device 101 according to various embodiments. Such a block diagram may indicate various example functional components of the electronic device 101 illustrated in FIG. 1.

Figure 4A:
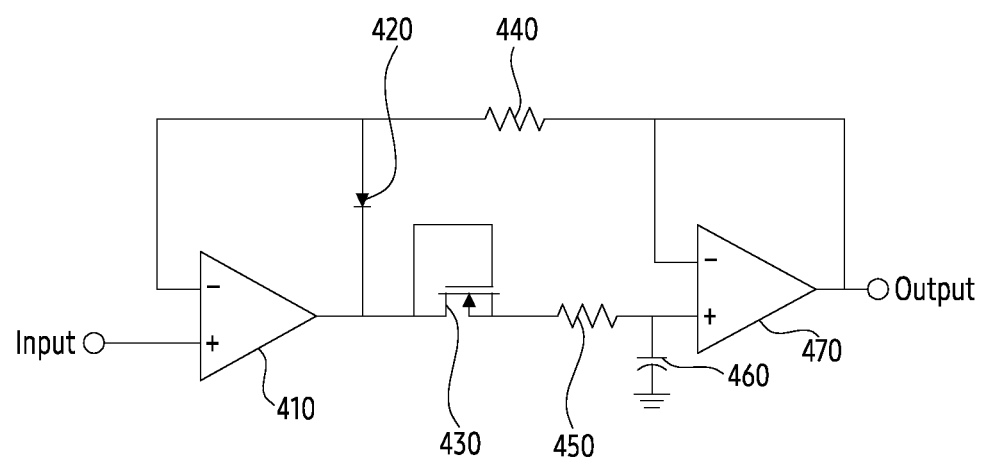
FIG. 4A is a circuit diagram illustrating an example configuration of a peak detector according to an embodiment.

FIG. 4A is a circuit diagram illustrating an example configuration of a peak detector 364 according to various embodiments.

Figure 4B:
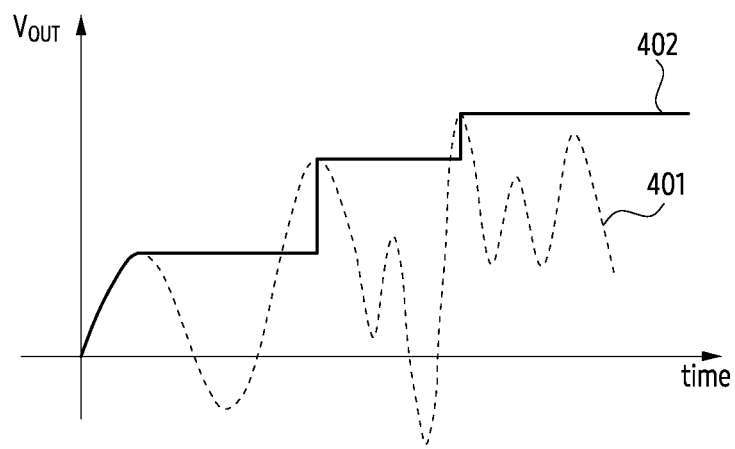
FIG. 4B is a graph illustrating an example of an input/output signal of a peak detector according to an embodiment.

FIG. 4B is a graph illustrating an example input signal of the peak detector 364 and an output signal of the peak detector 364 according to various embodiments.

Referring to FIG. 3, the electronic device 101 may include at least one processor 310, a radio frequency integrated circuit (RFIC) 320, a power management integrated circuit (PMIC) 330, a power amplifier module (PAM) 340, and an antenna 350.

The processor 310 in the electronic device 101 according to an embodiment may include at least one of the main processor 121 illustrated in FIG. 1 or the auxiliary processor 123 which is the communication processor.

The RFIC 320 in the electronic device 101 according to an embodiment may convert the baseband signal generated by the processor 310 (e.g., communication processor) into an RF signal in an intermediate frequency band (e.g., approximately 9 GHz to approximately 11 GHz) and generate an RF signal (hereinafter, an intermediate frequency (IF) signal) by upconverting the IF signal. By providing the RF signal to the PAM 340, the RFIC 320 may amplify the RF signal into a transmitting signal to match the transmitting power by the PAM 340.

According to an embodiment, the PMIC 330 may convert and provide a voltage provided from a battery (not shown). For example, the PMIC 330 may provide the PAM 340 with a bias voltage required to be amplified by the PA 380. For example, the PMIC 330 may provide the PAM 340 with a bias voltage required for the PA 380 to amplify. For another example, the PMIC 330 may supply power via a collector end of the PA 380.

According to an embodiment, the PAM 340 may include a controller 355, a protection circuit 360, a low drop out (LDO) 345, a switching circuit 370, a matching network circuit 375, a power amplifier (PA), a duplexer 385, and a low noise amplifier (LNA) 390. According to various embodiments, the PAM 340 including the LNA 390 may be referred to as LPAM.

The controller 355 within the PAM 340 may control a bias enable signal for the PA 380. For example, the controller 355 may activate a node providing a bias voltage connected to the switching circuit 370 by generating a bias enable signal of "logic high".

The controller 355 within the PAM 340 may control the voltage value of the target voltage $V_{ref}$ to vary. For example, the controller 355 in the PAM 340 may receive a control signal indicating a voltage value of the target voltage $V_{ref}$ from the processor 310. The controller 355 may transmit a control signal indicating a voltage value of the target voltage $V_{ref}$ to the LDO 345 based on the control signal received from the processor 310.

The LDO 345 may generate the target voltage $V_{ref}$ based on the control signal received from the controller 355 and provide it to the protection circuit 360. For example, the LDO 345 may generate a target voltage $V_{ref}$ corresponding to a value indicated by the control signal based on a voltage drop with respect to the power supply voltage VDD.

According to an embodiment, the protection circuit 360 may include a comparator 361, a NAND gate 362, an AND gate 363, and a peak detector 364.

The comparator 361 may compare the supply voltage provided from the PMIC 330 to the PA 380 with the target voltage $V_{ref}$. The comparator 361 may be implemented as an operational amplifier. An end of the comparator 361 may receive the target voltage $V_{ref}$ generated from the LDO 345. Another end of the comparator 361 may receive a sensing voltage sensing the supply voltage provided to the PA 380 from the PMIC 330. The comparator 361 may identify whether the supply voltage has reached the target voltage $V_{ref}$. For example, when the supply voltage provided from the PMIC 330 to the PA 380 is lower than the target voltage $V_{ref}$, the comparator 361 may generate a first signal of "logic low" or zero. The first signal may be output from the comparator 361 and provided to the NAND gate 362.

The NAND gate 362 may perform a logical operation between the first signal and the bias enable signal. For example, the NAND gate 362 may receive the first signal via an end and may receive the bias enable via the other end. The logical operation may be a negative logic product operation. The bias enable signal may correspond to a control signal generated by the controller 355. The bias enable signal of "logic high" or 1 may indicate that a bias voltage is provided to a node connected to the switching circuit 370. The NAND gate 362 may generate a second signal indicating a result of the logical operation to provide the second signal to the AND gate 363.

The peak detector 364 may detect that a transmitting signal being input from the RFIC 320. For example, the RFIC 320 may generate an RF signal and provide the generated RF signal to the PAM 340. The RF signal may be input to the PA 380 for being amplified as much as transmitting power. For example, the RF signal may be input to a base node of the PA 380. The peak detector 364 may sense the RF signal to detect a peak value among the RF signals and output the peak value. The peak detector 364 may generate a third signal indicating the peak value to provide the third signal to the AND gate 363.

Referring to FIG. 4A together, the peak detector 364 may include a first operational amplifier 410, a second operational amplifier 470, a first diode 420, a second diode 430, a first resistor 440, a second resistor 450, and a capacitor 460. Referring to FIG. 4B, a graph of the input signal 401 and the output signal 402 of the peak detector 364 are illustrated.

According to an embodiment, when the input signal 401 increases, the first diode 420 may be biased in the reverse direction and the second diode 430 may be biased in the forward direction. Accordingly, a current flowing on the first resistor 440 does not exist, and an output voltage may follow an input voltage. Based on the second operational amplifier 470, the output voltage may follow the voltage of the capacitor 460. The capacitor 460 may be charged to the output voltage by the output current of the first operational amplifier 410 flowing in through the second diode 430. The peak detector 364 may detect the peak value by following an increase of the input signal 401.

According to an embodiment, since the output of the first operational amplifier 410 is lower than the cathode voltage of the second diode 430 which is the same as the previous peak voltage stored in the capacitor 460 in a case where the input signal 402 decreases, the second diode 430 may be biased in the reverse direction when the input voltage decreases. The second diode 430 may be biased in the reverse direction. The first diode 420 may be forward biased and the hold state may be maintained until the input voltage reaches the same capacitor voltage as the output voltage (e.g., a fixed value of the output signal 402).

The AND gate 363 may perform a logical operation between the third signal received from the peak detector 364 and the second signal received from the NAND gate 362. For example, the AND gate 363 may receive the third signal via one end and receive the second signal via the other end, respectively. The logical operation may correspond to the logical product operation. The AND gate 363 may provide the switching circuit 370 with a fourth signal indicating a result of the logical operation of the second signal and the third signal.

The switching circuit 370 may identify applying a bias voltage to the PA 380 based on the fourth signal. The switching circuit 370 may include a PMOS transistor 371 and an NMOS transistor 372. The fourth signal may be input to a gate end of the PMOS transistor 371 and a gate end of the NMOS transistor 372, respectively.

The PMOS transistor 371 and the NMOS transistor 372 within the switching circuit 370 may complementary operate with each other. For example, the PMOS transistor 371 and the NMOS transistor 372 may receive the fourth signal of "logic high" or 1, respectively. When the fourth signal is "logic high", the PMOS transistor 371 may be turned off. When the PMOS transistor 371 is turned off, a connection between a node providing the bias voltage and a base node of the PA 380 may be opened. When the fourth signal is "logic high", the NMOS transistor 372 may be turned on. When the NMOS transistor 372 is turned on, the connection between the ground node and the base node of the PA 380 may be short, and the PA 380 may not amplify the RF signal.

For another example, the PMOS transistor 371 and the NMOS transistor 372 may receive the fourth signal of "logic low" or zero, respectively. When the fourth signal is "logic low", the PMOS transistor 371 may be turned on to be short, and the NMOS transistor 372 may be turned off to be opened. When the fourth signal is "logic low", the base node of the PA 380 may be connected to a node providing a bias voltage via the PMOS transistor 371. The PA 380 may amplify the RF signal based on the bias voltage.

The matching network circuit 375 may include at least one variable inductor (not shown) and at least one variable capacitor (not shown). The matching network circuit 375 may control respectively the inductance of at least one variable inductor (not shown) and the capacitance of the at least one variable capacitor (not shown) so that maximum power may be transmitted by performing impedance matching between the output impedance viewed by the PA 380 and the input impedance viewed by the duplexer 385.

The duplexer 385 may control a transmitting/receiving mode of the antenna 350. For example, the duplexer 385 may control to provide the receiving signal received from the outside via the antenna 350 to the LNA 390 or the transmitting signal received via the PA 380 and the matching network circuit 375 to the antenna 350. The LNA 390 may amplify the signal received via the antenna 350 and provide the amplified signal to the RFIC 320.

FIG. 5 is a diagram illustrating an example of a logic table capable of determining whether the PA 380 is in burnout according to various embodiments.

Referring to FIG. 5, the output of the comparator 361 may be "logic high" or "logic low".

Referring to FIG. 3 together, the output of the comparator 361 may correspond to the first signal. For example, when the supply voltage supplied from the PMIC 330 to the PA 380 is less than the target voltage $V_{ref}$, the first signal may be "logic low" or 0. For another example, when the supply voltage supplied from the PMIC 330 to the PA 380 exceeds the target voltage $V_{ref}$, the first signal may be "logic high" or 1.

According to an embodiment, when the first signal (e.g., the comparator output of FIG. 5) corresponds to "logic low", the output of the NAND gate 362 may always be "logic high". Referring to FIG. 3 together, the output of the NAND gate 362 may correspond to the second signal. Based on the first signal of "logic low", the NAND gate 362 may always output the second signal of "logic high" regardless of a value of the bias enable signal (e.g., PA Bias Enable). The AND gate 363 may output a fourth signal corresponding to a logic value of the third signal received from the peak detector 364. For example, when the third signal of "logic high" is received from the peak detector 364, the AND gate 363 may provide the fourth signal of "logic high" to the switching circuit 370. For another example, when the third signal of "logic row" is received from the peak detector 364, the AND gate 363 may provide the fourth signal of "logic row" to the switching circuit 370.

When the fourth signal of the "logic low" is provided to the switching circuit 370, the PA 380 may amplify the signal input via the base node based on the bias voltage. However, when the fourth signal is "logic low", a transmitting signal input via the peak detector 364 may not exist. Accordingly, since the PA 380 does not receive an input of the transmitting signal to be amplified, burnout of the PA 380 based on amplifying the transmitting signal at an incorrect timing may be prevented and/or reduced.

When the fourth signal of "logic high" is provided to the switching circuit 370, since a bias voltage is not applied, the PA 380 may not amplify the transmitting signal input via the base node. Since the PA 380 does not amplify the transmitting signal, burnout of the PA 380 based on amplifying the transmitting signal at an incorrect timing may be prevented and/or reduced.

According to an embodiment, when the first signal (e.g., the comparator output of FIG. 5) corresponds to "logic high", the output of the NAND gate 362 may be different according to the bias enable signal. For example, when the bias enable signal is "logic high", the NAND gate 362 may output a second signal of "logic low". For another example, when the bias enable signal is "logic low", the NAND gate 362 may output a second signal of "logic high".

According to an embodiment, even though the supply voltage reaches the target voltage $V_{ref}$, the bias enable signal may transition later than the arrival of the target voltage $V_{ref}$. That is, the first signal may be "logic high", and the bias enable signal may be "logic low". Accordingly, the second signal may be "logic high". When the second signal of "logic high" is provided to the AND gate 363, an output of the AND gate 363, that is, a value of the fourth signal may vary according to the third signal provided from the peak detector 364. For example, when the transmitting signal is input to the PAM 340, the third signal of the peak detector 364 is "logic high", and thus the fourth signal may also be equally "logic high". The switching circuit 370 may perform a switching operation to connect the base node and the ground node of the PA 380 based on the fourth signal of "logic high". The PA 380 does not amplify the transmitting signal input to the PAM 340, and thus burnout of the PA 380 may be prevented and/or reduced accordingly. For another example, when the transmitting signal is not input to the PAM 340, the third signal of the peak detector 364 is "logic low", and thus the fourth signal may also be "logic low". When the fourth signal is "logic high", the PA 380 may amplify a signal input via the base node based on the bias voltage. However, since the third signal is "logic low", a transmitting signal input to the PAM 340 may not exist. Accordingly, since the PA 380 does not receive an input of a transmitting signal to be amplified, burnout of the PA 380 based on amplifying the transmitting signal at an incorrect timing may be prevented and/or reduced.

According to an embodiment, when the supply voltage reaches the target voltage $V_{ref}$, the bias enable signal may be "logic high". Since both the first signal and the bias enable signal are "logic high", the second signal, which is the output of the NAND gate 362, may be "logic low". When the second signal of "logic row" is provided to the AND gate 363, the output of the AND gate 363, that is, the value of the fourth signal may be "logic low" independently of the third signal provided from the peak detector 364. The switching circuit 370 may electrically connect the base node of the DA 680 to a node providing a bias voltage by receiving the fourth signal of "logic low" and turning on the PMOS transistor 371 of the switching circuit 370. That is, before the transmitting signal is input to the PAM 340, since the bias enable signal is "logic high" and the supply voltage normally reaches the target voltage $V_{ref}$, the PA 380 may not be burned.

Figure 6:
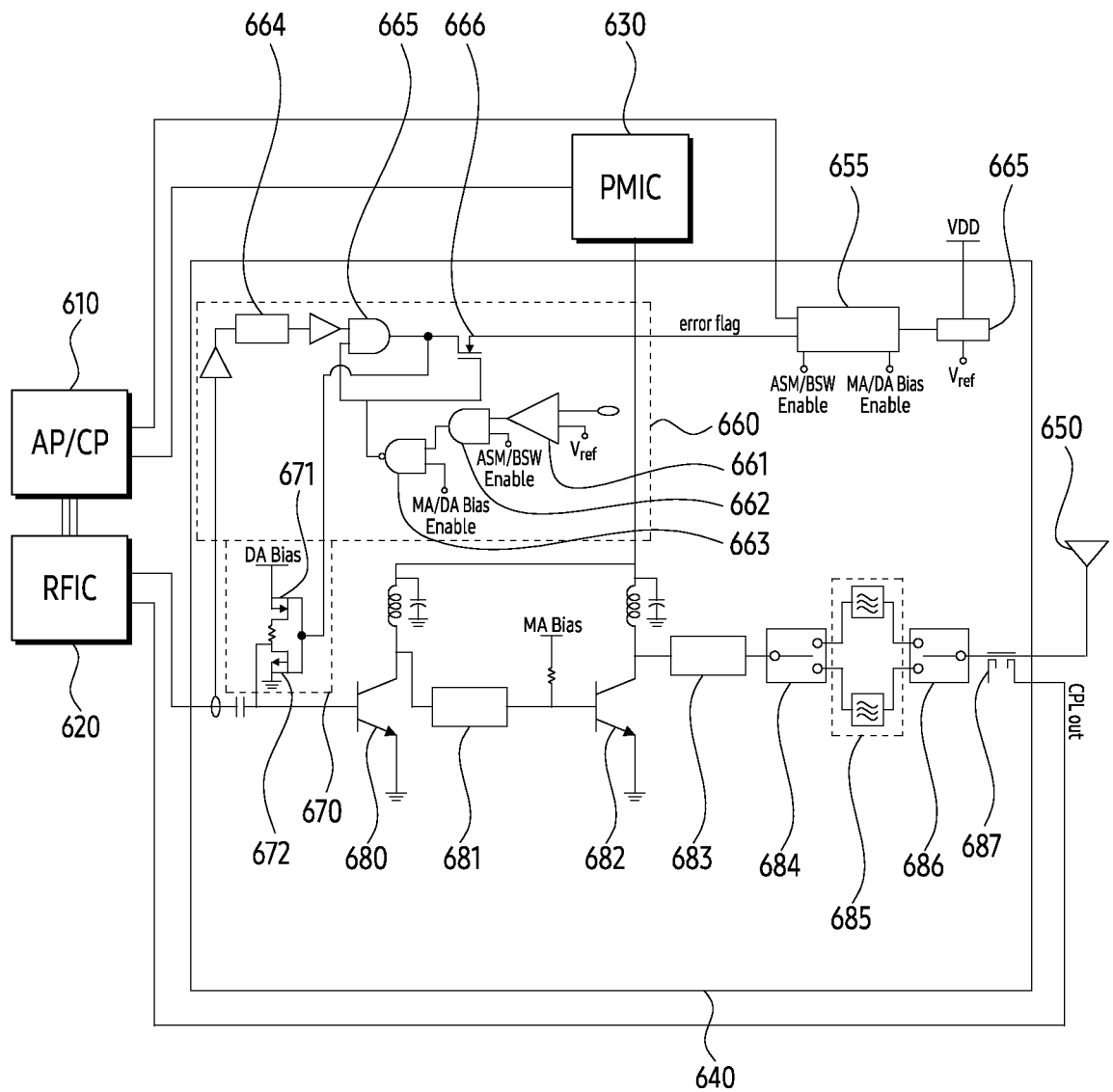
FIG. 6 is a block and circuit diagram illustrating an example configuration of an electronic device according to an embodiment.

FIG. 6 is a block and circuit diagram illustrating an example configuration of an electronic device 101 according to various embodiments.

Referring to FIG. 6, the electronic device 101 may include at least one processor 610, RFIC 620, PMIC 630, PAM 640, and antenna 650.

The processor 610 within the electronic device 101 according to an embodiment may include at least one of the main processor 121 illustrated in FIG. 1 and the auxiliary processor 123 which is the communication processor.

According to an embodiment, the RFIC 620 in the electronic device 101 may convert the baseband signal generated by the processor 610 (e.g., a communication processor) into an RF signal (hereinafter, an intermediate frequency (IF) signal) of an intermediate frequency band (e.g., about 9 GHz to about 11 GHz) and generate an RF signal by upconverting the IF signal. By providing the RF signal to the PAM 640, the RFIC 620 may amplify the RF signal to have power (e.g., transmit power) for transmitting the RF signal to an external electronic device by the PAM 640. For example, the transmitting signal may be amplified via the DA 680 and the PA 682.

According to an embodiment, the PMIC 630 may convert and provide a voltage provided from a battery (not shown). For example, the PMIC 630 may provide the PAM 340 with a bias voltage required for the driving amplifier (DA) 680 and the power amplifier (PA) 682 to amplify the transmitting signal. For another example, the PMIC 630 may supply power via a collector node of the DA 680 and a collector node of the PA 682.

According to an embodiment, the PAM 640 may include a controller 655, a protection circuit 660, an LDO 645, a switching circuit 670, a DA 681, an inter matching circuit 681, a matching network circuit 683, a band selection switch 684, a plurality of band pass filter 685, an antenna selection module 686, and a coupler 687.

The controller 655 within the PAM 640 according to an embodiment may control at least one enable signal required to successfully amplify the transmitting signal. For example, the at least one enable signal may include at least one of a DA bias enable signal for providing a bias voltage to the DA 680, a PA bias enable signal for providing a bias voltage to the PA 682, a BSW enable signal for controlling the band selection switch 684, and an ASM enable signal for controlling the antenna selection module 686.

The controller 655 within the PAM 640 according to an embodiment may receive an error flag and transmit a control signal for indicating that the error flag has occurred to the processor 610. The error flag may be information indicating that a possibility of burnout of the PA 682 is exist because the timing at which the at least one enable signal is applied and the timing at which the transmitting signal is input do not match each other. The processor 610 may suspend providing a transmitting signal to the PAM 640 via the RFIC 620 in response to receiving the error flag from the controller 655.

The LDO 645 may generate the target voltage $V_{ref}$ based on the control signal received from the controller 655 and provide the target voltage $V_{ref}$ to the protection circuit 360. For example, the LDO 645 may voltage drop the power supply voltage VDD to generate a target voltage $V_{ref}$ corresponding to a voltage value indicated by the control signal. The generated target voltage $V_{ref}$ may be provided to the comparator 661 in the protection circuit 660.

According to an embodiment, the protection circuit 660 may include a comparator 661, a first AND gate 662, a NAND gate 663, a peak detector 664, and a second AND gate 665.

The comparator 661 may compare a supply voltage provided from the PMIC 630 to the DA 680 and the PA 682 with a target voltage $V_{ref}$ provided from the LDO 645. The comparator 661 may be implemented as an operational amplifier. One end of the comparator 661 may receive the target voltage $V_{ref}$ provided from the LDO 645. The other end of the comparator 661 may receive a value obtained by sensing a supply voltage provided to the DA 680 and the PA 682 from the PMIC 630. The comparator 661 may identify whether the supply voltage reaches the target voltage $V_{ref}$. For example, when the supply voltage provided from the PMIC 630 to the DA 680 is lower than the target voltage $V_{ref}$, the comparator 661 may generate a first signal of "logic low" or zero. The first signal may be output from the comparator 661 and provided to the first AND gate 662.

The first AND gate 662 may perform a logical operation between the first signal, and at least one enable signal for selecting a frequency band. The logical operation may be a logical product operation. The at least one enable signal for selecting the frequency band may include a BSW enable signal for controlling the band selection switch 684 and an ASM enable signal for controlling the antenna selection module 686. The first AND gate 662 may receive the first signal from the comparator 661 via one end. The first AND gate 662 may receive the BSW enable signal and the ASM enable signal from the controller 655 via the other end. The first AND gate 662 may generate a second signal indicating a result of a logical operation between the first signal and at least one enable signal for selecting the frequency band and provide the second signal to the NAND gate 663.

The NAND gate 663 may perform a logical operation between the second signal and the bias enable signal. For example, the NAND gate 663 may receive the second signal via one end and may receive the bias enable signal via the other end. The bias enable signal may include a DA bias enable signal for applying a bias voltage to the DA 680 and a PA bias enable signal for applying a bias voltage to the PA 682. The logical operation may be a negative logic product operation. The logical operation may be a negative logic product operation. The bias enable signal may correspond to a control signal generated by the controller 655. The NAND gate 663 may generate a third signal indicating a result of the logical operation and provide the third signal to the second AND gate 665.

The peak detector 664 may detect that a transmitting signal is input from the RFIC 620. For example, the RFIC 320 may generate an RF signal and provide the generated RF signal to the PAM 640. Since the transmitting signal has a high peak to average power ratio (PAPR), the peak detector 664 may sense the transmitting signal input to the PAM 640 and detect a peak value, thereby identifying whether the transmitting signal is input to the PAM 640. The peak detector 664 may generate a fourth signal indicating the peak value and provide the fourth signal to the second AND gate 665. According to various embodiments, the peak detector 664 may further include each of buffers at a front end and a rear end. Each of the buffers may amplify the sensed transmitting signal to provide the peak detector 664, and may amplify the peak detection result output from the peak detector 664 to generate a fourth signal having a logic value of "logic high".

The second AND gate 665 may perform a logical operation between the fourth signal received from the peak detector 664 and the third signal received from the NAND gate 663. For example, the second AND gate 665 may receive the third signal from the NAND gate 663 via one end and the fourth signal from the peak detector 664 via the other end. The logical operation may be a logical product operation. The second AND gate 665 may provide a fifth signal indicating a result of a logical operation between the third signal and the fourth signal to the switching circuit 670.

The switching circuit 670 may identify applying a bias voltage to the DA 680 based on the fifth signal. The switching circuit 370 may include a PMOS transistor 671 and an NMOS transistor 672. The fifth signal may be input to a gate end of the PMOS transistor 671 and a gate end of the NMOS transistor 672, respectively. Accordingly, when the fifth signal is "logic low", the switching circuit 670 may apply the DA bias voltage by connecting the node providing the DA bias voltage and the base node of the DA 680. When the fifth signal is "logic high", the switching circuit 670 may not apply the DA bias voltage by connecting the base node of the DA 680 to the ground node.

The DA 680 may receive a transmitting signal via the base node, amplify the transmitting signal based on the DA bias node, and transmit the transmitting signal to the PA 682. The inter matching circuit 681 may perform impedance matching between the output impedance of the DA 680 and the input impedance of the PA 682 to transmit the maximum power to the PA 682. The inter matching circuit 681 may include at least one variable capacitor (not shown) and at least one variable inductor (not shown) for the impedance matching. The PA 682 may receive the first amplified transmitting signal via the DA 680 to perform the second amplified signal.

The matching network circuit 683 may perform impedance matching between the output impedance viewed from the PA 682 and the input impedance viewed from the band selection switch 684. The matching network circuit 683 may control the inductance of at least one variable inductor (not shown) and the capacitance of at least one variable capacitor (not shown) so that the maximum power is transmitted through the impedance matching.

The band selection switch 684 may connect the matching network circuit 683 and any one filter among a plurality of band pass filters 685. For example, when the number of the plurality of band pass filters 685 is eight, the band selection switch 684 may be implemented as a single pole 8 throw (SP8T). For another example, when the number of the plurality of band pass filters 685 is four, the band selection switch 684 may be implemented as an SP4T.

The antenna selection module 686 may connect one band pass filter connected to the band selection switch 684 among the plurality of band pass filters 685, and the antenna 650. Referring to FIG. 6, since the electronic device 101 includes only one antenna (e.g., an antenna 650), the antenna selection module 686 may be a single-pole switch. For example, when the number of the plurality of band pass filters 685 is eight, the antenna selection module 686 may be implemented as an SP8T. When the electronic device 101 includes two antennas, the antenna selection module 686 may be implemented as a dual pole 8 through (DP8T).

The coupler 687 may generate a coupling signal (e.g., CPL out) based on the transmitting signal to be output via the antenna 650. The coupling signal (e.g., CPL out) may be fed back to the RFIC 620 and used to measure the performance of the PAM 640.

FIG. 7 is a diagram illustrating an example logic table capable of determining whether a PA 682 is in burnout according to various embodiments.

Referring to FIG. 7, the output of the comparator 661 may be "logic high" or "logic low". Referring to FIG. 6 together, the output of the comparator 661 may correspond to the first signal. For example, when the supply voltage supplied from the PMIC 630 to the DA 680 and the PA 682 is less than the target voltage $V_{ref}$, the first signal may be "logic low" or 0. For another example, when the supply voltage supplied from the PMIC 630 to the DA 680 and the PA 682 exceeds the target voltage $V_{ref}$, the first signal may be "logic high" or 1.

According to an embodiment, when the first signal (e.g., the comparator output of FIG. 7) corresponds to "logic low", the output of the first AND gate 662 (e.g., the AND#1 output of FIG. 7) may always be "logic low". Referring to FIG. 3 together, the output of the first AND gate 662 may correspond to the second signal (e.g., the NAND#1 output of FIG. 7). The first AND gate 662 may always output the second signal of "logic low" independently of the logic value of at least one enable signal for a frequency band selection based on the first signal of "Logic Low". The second signal may be provided to the NAND gate 663. When the supply voltage provided from the PMIC 630 to the DA 680 and the PA 682 does not reach the target voltage $V_{ref}$ (the first signal is "logic low"), the second signal is always "logic low", and thus the NAND gate 663 may output a third signal of "logic high". That is, when the second signal is logic low", the NAND gate 663 may always provide the third signal of "logic high" independently of the logic value of the bias enable signal to the second AND gate 665 and the NMOS transistor 666. The NMOS transistor 666 may be turned on based on the third signal of "logic high" to connect the second AND gate 665 and the controller 655.

Since the third signal is always "logic high", the output of the second AND gate 665 may vary according to the logic value of the fourth signal of the peak detector 664. For example, when the fourth signal of the peak detector 664 is "logic high", the fifth signal (e.g., the AND#2 output of FIG. 7) corresponding to the output of the second AND gate 665 may be "logic high". For another example, when the fourth signal of the peak detector 664 is "logic row", the fifth signal corresponding to the output of the second AND gate 665 may be "logic row".

When the transmitting signal is not input to the PAM 640, the fourth signal and the fifth signal may be "logic low". The switching circuit 670 may connect a base node of the DA 680 to a node providing a DA bias voltage based on the fifth signal of the "logic row". That is, the DA 680 may amplify the signal input via the base node, but burnout of the PA 682 may not occur since the transmitting signal is not input to the DA 680.

When the transmitting signal is input to the PAM 640, the fourth signal and the fifth signal may be "logic high". The switching circuit 670 may connect the base node and the ground node of the DA 680 based on the fifth signal of "logic high". That is, the DA 680 may not be able to amplify the transmitting signal input to the PAM 640 because the DA bias voltage is not applied. Since the transmitting signal is not amplified, burnout of the PA 682 may not occur. Meanwhile, when the fifth signal is "logic high", the controller 655 may identify the error flag. The NMOS transistor 666 may be turned on based on the third signal of "logic high" to connect the second AND gate 665 and the controller 655. When the output of the second AND gate 665 is the fifth signal of "logic high", the controller 655 may receive a signal of "logic high" from the second AND gate 665. The controller 655 may identify an error flag based on the "logic high" signal. The error flag may be a signal indicating that the setting for amplifying the transmitting signal is not completed. In the above-described embodiment, the error flag may be generated based on the supply voltage provided from the PMIC 630 being lower than the target voltage $V_{ref}$. The controller 655 may report generation of the error flag to the processor 610 in response to the identification of the error flag. The processor 610 may suspend inputting the transmitting signal to the PAM 640 in response to receiving the report from the controller 655.

According to an embodiment, even though the supply voltage reaches the target voltage $V_{ref}$, at least one enable signal for selecting the frequency band may still be "logic low". That is, the first signal may be "logic high", and the BSW enable signal and the ASM enable signal may be "logic low". Accordingly, the first AND gate 662 may provide the second signal of "logic row" to the NAND gate 663. The NAND gate 663 may always provide a third signal of "logic high" to the second AND gate 665 and the NMOS transistor 666 based on the second signal of "logic low". That is, when the ASM enable signal and the BSW enable signal are "logic low", the NAND gate 663 may always generate a third signal of "logic high" regardless of the logic value of the bias enable signal. Since the third signal is always "logic high", the output of the second AND gate 665 may vary according to the logic value of the fourth signal output from the peak detector 664.

When the transmitting signal is not input to the PAM 640, the fourth signal and the fifth signal may be "logic low". The switching circuit 670 may connect a base node of the DA 680 to a node providing a DA bias voltage based on the fifth signal of the "logic row". That is, the DA 680 may amplify the signal input via the base node, but burnout of the PA 682 may not occur since the transmitting signal is not input.

When the transmitting signal is input to the PAM 640, the fourth signal and the fifth signal may be "logic high". The switching circuit 670 may connect the base node and the ground node of the DA 680 based on the fifth signal of "logic high". That is, the DA 680 may not be able to amplify the transmitting signal input to the PAM 640 because the DA bias voltage is not applied. Since the transmitting signal is not amplified, burnout of the PA 682 may not occur. Meanwhile, when the fifth signal is "logic high", the controller 655 may identify the error flag. The NMOS transistor 666 may be turned on based on the third signal of "logic high" to connect the second AND gate 665 and the controller 655. When the output of the second AND gate 665 is "logic high", the controller 655 may receive a signal of "logic high" from the second AND gate 665. The controller 655 may identify an error flag based on the "logic high" signal. The error flag may be a signal indicating that the setting for amplifying the transmitting signal is not completed. In the above-described embodiment, the error flag may be generated based on the delay in setting the at least one enable signal for selecting frequency band to "logic high". The controller 655 may report generation of the error flag to the processor 610 in response to the identification of the error flag. The processor 610 may suspend inputting the transmitting signal to the PAM 640 in response to receiving the report from the controller 655.

According to an embodiment, even when the supply voltage reaches the target voltage $V_{ref}$ and at least one enable signal for selecting the frequency band is "logic high", the bias enable signal may still be "logic low".

Since the first signal, the ASM enable signal, and the BSW enable signal are all "logic high", the second signal, which is the output of the first AND gate 662, may be "logic high". When the second signal of "logic high" is provided to the NAND gate 663, the output of the NAND gate 663, that is, the value of the third signal may vary according to the logic value of the bias enable signal. For example, when the logic value of the bias enable signal is "logic low", a third signal which output from the NAND gate 663 based on the second signal of "logic high" and the logical operation may be "logic high". Since the third signal is "logic high", the output of the second AND gate 665 may vary according to the logic value of the fourth signal output from the peak detector 664.

When the transmitting signal is not input to the PAM 640, the fourth signal and the fifth signal may be "logic low". The switching circuit 670 may connect a base node of the DA 680 and a node providing a DA bias voltage based on the fifth signal of the "logic row". That is, the DA 680 may amplify the signal input via the base node, but burnout of the PA 682 may not occur since the transmitting signal is not input.

When the transmitting signal is input to the PAM 640, the fourth signal and the fifth signal may be "logic high". The switching circuit 670 may connect the base node and the ground node of the DA 680 based on the fifth signal of "logic high". That is, the DA 680 may not be able to amplify the transmitting signal input to the PAM 640 because the DA bias voltage is not applied. Since the transmitting signal is not amplified, burnout of the PA 682 may not occur. Meanwhile, when the fifth signal is "logic high", the controller 655 may identify the error flag. The NMOS transistor 666 may be turned on based on the third signal of "logic high" to connect the second AND gate 665 and the controller 655. When the output of the second AND gate 665 is "logic high", the controller 655 may receive a signal of "logic high" from the second AND gate 665. The controller 655 may identify the error flag based on the "logic high" signal. The error flag may be a signal indicating that the setting for amplifying the transmitting signal is not completed. In the above-described embodiment, the error flag may be generated based on the delay in setting the bias enable signal to "logic high". The controller 655 may report generation of the error flag to the processor 610 in response to the identification of the error flag. The processor 610 may suspend inputting the transmitting signal to the PAM 640 in response to receiving the report from the controller 655.

According to an embodiment, the supply voltage may reach the target voltage $V_{ref}$, and at least one enable signal and the bias enable signal for selecting the frequency band may correspond to "logic high", respectively. Since the first signal, the BSW enable signal, the ASM enable signal, and the bias enable signal are all "logic high", the third signal, output of the NAND gate 663, may be "logic low". When the third signal of "logic row" is provided to the second AND gate 665, the output of the second AND gate 665, that is, the value of the fifth signal may always be "logic row". That is, the fifth signal may always be "logic low" independently of the logic value of the fourth signal of the peak detector 664. The switching circuit 670 may electrically connect the base node of the DA 680 and the node providing the DA bias voltage by receiving the fifth signal of the "logic low" and turning on the PMOS transistor 671 of the switching circuit 670. That is, when the transmitting signal is input to the PAM 640, the PA 682 may not be burned, since at least one enable signal and the bias enable signal for selecting the frequency band are set to "logic high", and the supply voltage normally reaches the target voltage $V_{ref}$.

According to various embodiments, when the PAM 640 does not include the protection circuit 660 according to the above-described embodiment, the PA 682 may be burned out. For example, when the bias enable signal is "logic high" and the supply voltage provided from the PMIC 630 reaches the target voltage $V_{ref}$, at least one enable signal for frequency band selection may be "logic low". For example, the BSW enable signal may be "logic low". In this case, when the transmitting signal is input to the PAM 640, the transmitting signal may be amplified via the DA 680 and the PA 682, and then transferred to the band selection switch 684. Since the BSW enable signal for the band selection switch 684 is "logic low", the band selection switch 684 may be in an off state. When the amplified transmitting signal proceeds to the band selection switch 684 in the off state, the transmitting signal may be reflected in a direction having high impedance by the band selection switch 684. That is, the amplified transmitting signal may be reflected by the PA 682 to cause burnout of the PA 682.

Figure 8:
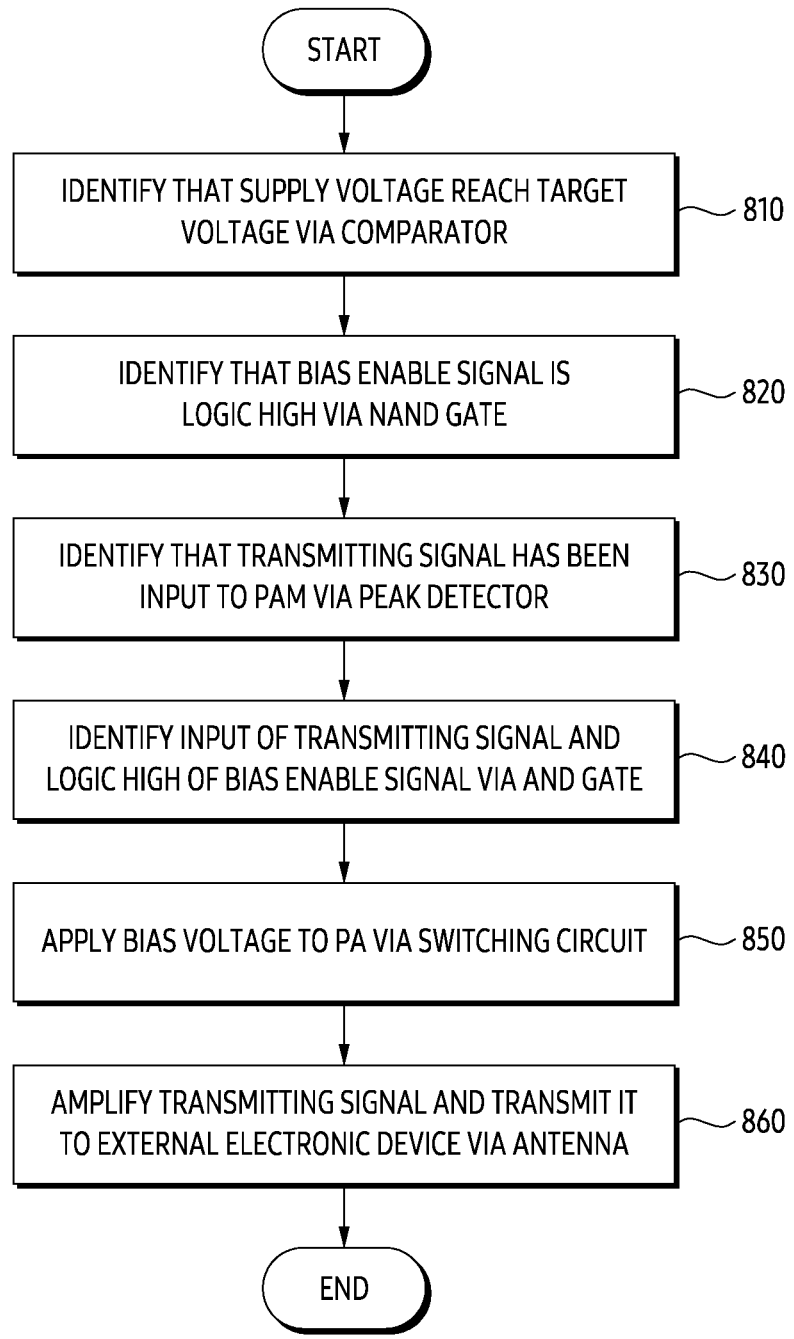
FIG. 8 is a flowchart illustrating an example method of operating a power amplifier module (PAM) according to an embodiment.

FIG. 8 is a flowchart illustrating an example method of operating a power amplifier module (PAM) 340 according to various embodiments.

Referring to FIG. 8, in operation 810, the PAM 340 may identify that the supply voltage reaches the target voltage via the comparator 361. The supply voltage may refer to a voltage provided from the PMIC 330 to the PA 380. The PAM 340 may identify that the supply voltage has reached the target voltage based on identifying that the first signal output from the comparator 361 is "logic high".

In operation 820, the PAM 340 may identify that the bias enable signal is "logic high" via the NAND gate 362. The NAND gate 362 may output a second signal of "logic low" only when both the bias enable signal and the first signal are "logic high". The PAM 340 may identify that the bias enable signal is "logic high" based on the logic value of the second signal.

In operation 830, the PAM 340 may identify that the transmitting signal is input to the PAM 340 via the peak detector 364. When a peak value is detected by sensing a transmitting signal input to the PA 380, the peak detector 364 may output a third signal of "logic high". The PAM 340 may identify that the transmitting signal is input to the PAM 340 based on the logic value of the third signal.

In operation 840, the PAM 340 may identify the input of the transmitting signal and the "logic high" of the bias enable signal via the AND gate 363. The PAM 340 may identify an input of a transmitting signal based on "logic high" of the third signal. The PAM 340 may identify the reaching of the target voltage and the "logic high" of the bias enable signal based on the "logic low" of the second signal. The AND gate 363 may output the fourth signal of "logic row" to the switching circuit 370.

In operation 850, the PAM 340 may apply a bias voltage to the PA 380 via the switching circuit 370. The switching circuit 370 may apply a bias voltage to the PA 380 based on a fourth signal of "logic low".

In operation 860, the PAM 340 may amplify the transmitting signal via the PA 380 and transmit the amplified transmitting signal to the external electronic device via the antenna 350. The PA 380 may amplify the transmitting signal based on the bias voltage applied from the switching circuit 370. The amplified transmitting signal may be transmitted to an external electronic device via a matching network circuit 375, a duplexer 385, and the antenna 350.

Figure 9:
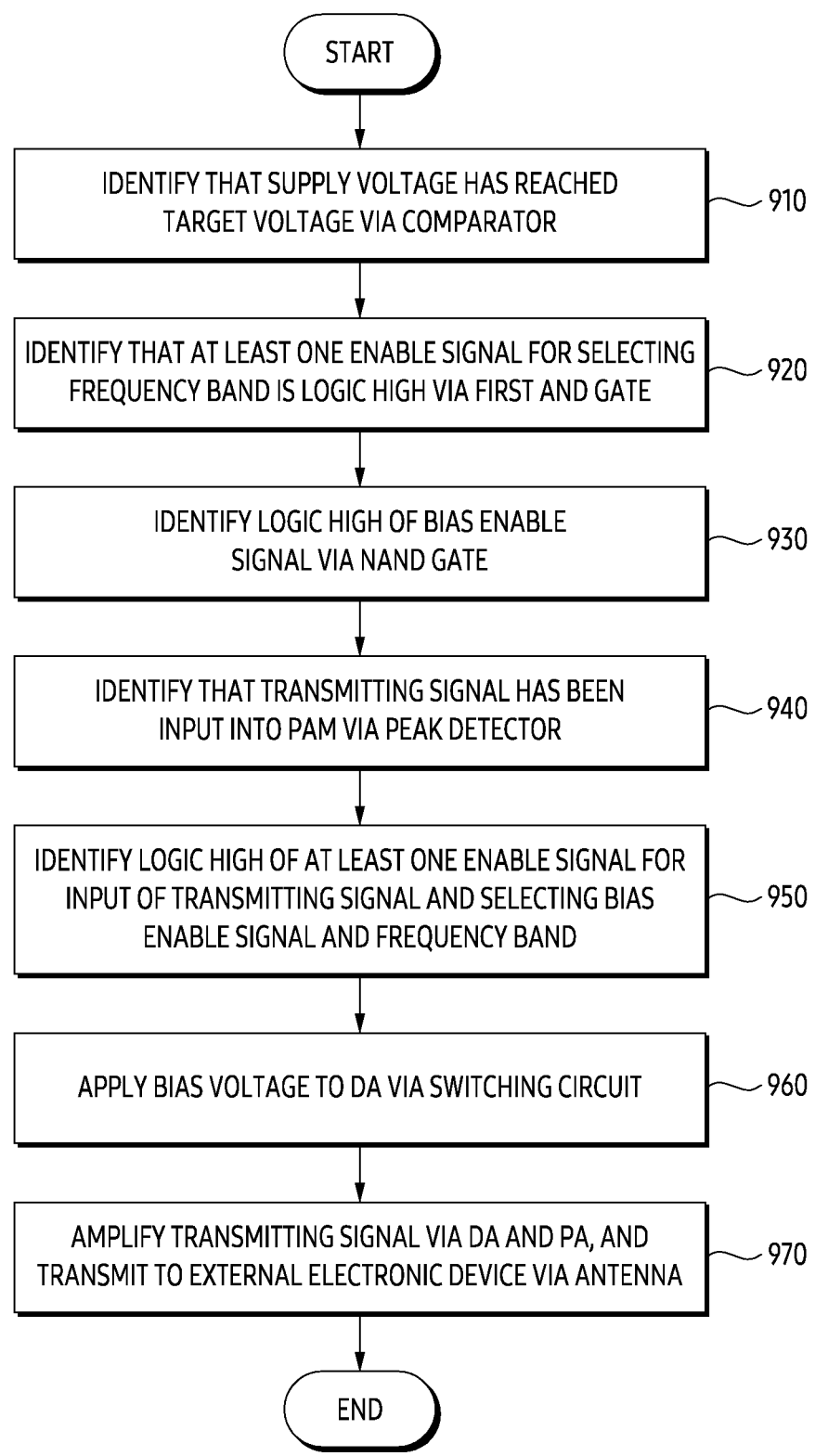
FIG. 9 is a flowchart illustrating an example method of operating a PAM according to an embodiment.

FIG. 9 is a flowchart illustrating an example method of operating a PAM 640 according to various embodiments.

Referring to FIG. 9, in operation 910, the PAM 640 may identify that the supply voltage has reached the target voltage via the comparator 661. The supply voltage may refer to a voltage provided from the PMIC 630 to the DA 680 and the PA 682. The PAM 640 may identify that the supply voltage has reached the target voltage based on identifying that the first signal output from the comparator 661 is "logic high".

In operation 920, the PAM 640 may identify that at least one enable signal for frequency band selection is "logic high" via the first AND gate 662. The at least one enable signal may include a BSW enable signal for a band selection switch 684 and an ASM enable signal for an antenna selection module 686. The first AND gate 662 may output a second signal of "logic high" only when both the at least one enable signal and the first signal are "logic high". The PAM 340 may identify that at least one enable signal for selecting the frequency band is "logic high" based on the logic value of the second signal.

In operation 930, the PAM 640 may identify that the bias enable signal is "logic high" via the NAND gate 663. The bias enable signal may include a bias enable signal for DA 680 and a bias enable signal for PA 682. The NAND gate 663 may output a third signal of "logic low" only when both the bias enable signal and the second signal are "logic high". The PAM 640 may identify that the bias enable signal is "logic high" based on the logic value of the third signal.

In operation 940, the PAM 640 may identify that the transmitting signal is input to the PAM 640 via the peak detector 664. When a peak value is detected by sensing a transmitting signal input to the DA 680, the peak detector 664 may output a fourth signal of "logic high". The PAM 340 may identify that the transmitting signal is input to the PAM 640 based on the logic value of the fourth signal.

In operation 950, the PAM 340 may identify an input of a transmitting signal, at least one enable signal for selecting a frequency band, and a "logic high" of the bias enable signal via the second AND gate 665. The PAM 640 may identify an input of a transmitting signal based on "logic high" of the fourth signal. The PAM 640 may identify reaching the target voltage, a "logic high" of the bias enable signal, and a "logic high" of at least one enable signal for the frequency band selection, based on the "logic low" of the third signal. The second AND gate 665 may output the fifth signal of the "logic row" to the switching circuit 670.

In operation 960, the PAM 640 may apply a bias voltage to the DA 680 via the switching circuit 670. The switching circuit 670 may apply a bias voltage to the DA 680 based on the fifth signal of the "logic row".

In operation 970, the PAM 640 may amplify the transmitting signal via the DA 680 and the PA 682 and transmit the amplified transmitting signal to the external electronic device via the antenna 650. The DA 680 may primarily amplify the transmitting signal based on the bias voltage applied from the switching circuit 670. The primary amplified transmitting signal may be secondarily amplified via the PA 682 and transmitted to an external electronic device via the antenna 350.

According to an embodiment, an electronic device (e.g., electronic device 101) may comprise: an antenna (e.g., antenna 350); a power amplifier module (PAM) (e.g., PAM 340) connected to the antenna, an including a power amplifier (PA) (e.g., PA 380) configured to amplify a transmitting signal for being transmitted to an external electronic device, and a protection circuit (e.g., protection circuit 360); a power management integrated circuit (PMIC) (e.g., PMIC 330) configured to supply voltage to the PA; and at least one processor (e.g., processor 310), wherein the at least one processor may be configured to: via a comparator (e.g., comparator 361) in the protection circuit, provide a first signal to a NAND gate in the protection circuit, in response to identifying that the supply voltage provided from the PMIC to the PA reaches to a target voltage corresponding to a transmitting voltage of the transmitting signal; via the NAND gate (e.g., NAND gate 362), provide, to an AND gate in the protection circuit, a second signal indicating a result of a logical operation between the first signal and a bias enable signal for the PA; via a peak detector (e.g., peak detector 364) in the protection circuit, provide, to the AND gate, a third signal indicating whether the transmitting signal is input to the PAM; via the AND gate (e.g., AND Gate 363), provide, to a switching circuit, a fourth signal indicating a result of logical operation between the second signal and the third signal; via the switching circuit (e.g., switching circuit 370) in the protection circuit, identify whether to apply a bias voltage to the PA, based on the fourth signal; and using the PA to which the bias voltage applied, transmit the transmitting signal, to the external electronic device, via the antenna.

In an embodiment, the at least one processor may be configured to transmit the transmitting signal, to the external electronic device, via a transmitting filter of a duplexer.

In an embodiment, the PAM may include an impedance matching circuit connecting the PA and the duplexer, and wherein the impedance matching circuit includes at least one variable capacitor and at least one variable inductor configured to match between an output impedance of the PA and an input impedance of the duplexer.

In an embodiment, the PAM may further include an LDO (low drop out), converting a power supply voltage value to the target voltage, and providing the target voltage, to the comparator in the protection circuit.

In an embodiment, the second signal, generated from the NAND gate in the protection circuit, may correspond to logic low, based on the bias enable signal corresponding to logic low, wherein the fourth signal, generated from the AND gate in the protection circuit, may correspond to logic low, independently from a logic value of the third signal, and wherein the switching circuit in the protection circuit may be configured to bypass providing of the bias voltage to the PA.

In an embodiment, based on the third signal indicating whether the transmitting signal is input to the PAM corresponding to logic low, the fourth signal generated from the AND gate in the protection circuit, may correspond to logic low, independently from a logic value of the second signal, and wherein the switching circuit in the protection circuit, may be configured to bypass providing of the bias voltage to the PA.

In an embodiment, the switching circuit may include PMOS transistor and NMOS transistor; wherein a source node of the PMOS transistor may be connected to a node providing the bias voltage; and wherein a source node of the NMOS transistor may be connected to a ground node.

In an embodiment, the switching circuit may be configured to, based on the fourth signal corresponding to logic low, connect the node providing the bias voltage and a base node of the PA by turning on the PMOS transistor and turning off the NMOS transistor, and based on the fourth signal corresponding to logic high, connect the ground node and the base node, by turning off the PMOS transistor, and turning on the NMOS transistor.

In an embodiment, the PAM may further include a controller configured to generate the bias enable signal and indicate a value of the target voltage to the LDO.

According to an example embodiment, an electronic device may comprise: an antenna (e.g., antenna 650); a power amplifier module (PAM) (e.g., PAM 640) connected to the antenna, and including a driving amplifier (DA) (e.g., DA 680) and a power amplifier (PA) (e.g., PA 682) configured to amplify a transmitting signal for being transmitted to an external electronic device, and a protection circuit (e.g., protection circuit 660); a power management integrated circuitry (PMIC) (e.g., PMIC 630) configured to supply voltage to the DA and the PA; and at least one processor (e.g., processor 610), wherein the at least one processor may be configured to: via a comparator (e.g., comparator 661) in the protection circuit, provide a first signal, to a first AND gate (e.g., first AND gate 662) in the protection circuit, in response to identifying that the supply voltage provided from the PMIC to the DA and the PA reaches a target voltage corresponding to a transmitting voltage of the transmitting signal; via the first AND gate, provide, to a NAND gate (e.g., NAND gate 663) in the protection circuit, a second signal indicating a result of a logical operation between the first signal and at least one enable signal for selecting a frequency band of the transmitting signal, via the NAND gate, provide, to a second AND gate in the protection circuit, a third signal indicating a result of a logical operation between the second signal and a bias enable signal for the DA and the PA; via a peak detector (e.g., peak detector 664) in the protection circuit, provide, to the second AND gate (e.g., second AND gate 665), a fourth signal indicating whether the transmitting signal is input to the PAM; via the second AND gate, provide, to a switching circuit (e.g., switching circuit 670), a fifth signal indicating a result of logical operation between the third signal and the fourth signal; via the switching circuit in the protection circuit, identify whether to apply a bias voltage to the DA, based on the fifth signal, and using the DA and the PA to which the bias voltage is applied, transmit the transmitting signal, to the external electronic device, via the antenna.

In an embodiment, the PAM may further include: a plurality of band pass filters configured to select any one of a plurality of frequency bands where the transmitting signal is delivered, a band selection switch configured to connect between an output end of the PA and the plurality of band pass filter, and an antenna selection module comprising circuitry configured to connect between the antenna and the plurality of band pass filter.

In an embodiment, the PAM may further include an impedance matching circuit configured to connect between the PA and the band selection switch, and wherein the impedance matching circuit may include at least one variable capacitor and at least one variable inductor configured to match between an output impedance of the PA and an input impedance of the band selection switch.

In an embodiment, the PAM further may include an LDO (low drop out) configured to convert a power supply voltage value to the target voltage, and providing the target voltage, to the comparator in the protection circuit.

In an embodiment, based on the at least one enable signal for selecting a frequency band of the transmitting signal being logic low, the second signal being generated from the first AND gate in the protection circuit, may correspond to logic low, and wherein the third signal being generated from the NAND gate in the protection circuit, may correspond to logic high, independently from a logic value of the second signal.

In an embodiment, based on the fourth signal being logic high, the fifth signal generated from the second AND gate in the protection circuit, may correspond to logic high, and wherein the switching circuit in the protection circuit may be configured to bypass providing the bias voltage to the DA.

In an embodiment, based on the bias enable signal corresponding to logic low, the third signal generated from the NAND gate in the protection circuit, may correspond to logic high, independently from the second signal.

In an embodiment, based on the fourth signal corresponding to logic high, the fifth signal generated from the second AND gate in the protection circuit, may correspond to logic high, and wherein the switching circuit in the protection circuit may be configured to bypass providing the bias voltage to the DA.

In an embodiment, the switching circuit may include PMOS transistor and NMOS transistor, wherein a source node of the PMOS transistor may be connected to a node providing the bias voltage, and wherein a source node of the NMOS transistor may be connected to a ground node.

In an embodiment, the switching circuit may be configured to, based on the fifth signal being logic low, connect between a base node of the DA and the node providing the bias voltage, by turning on the PMOS transistor and turning off the NMOS transistor, and based on the fifth signal being a logic high, connect between the base node of the DA and the ground node, by turning off the PMOS transistor and turning on the NMOS transistor.

In an embodiment, the PAM may further include a controller configured to generate the bias enable signal and the at least one enable signal for selecting a frequency band of the transmitting signal, and indicate a value of the target voltage to the LDO.

In an embodiment, the switching circuit may further include an NMOS transistor connecting the second AND gate and the controller, and the NMOS transistor may be configured to be turned on or off based on a third signal output from the NAND gate.

In an embodiment, the NMOS transistor may be configured to electrically connect the second AND gate and the controller based on the third signal corresponding to logic high, and provide the controller with the fifth signal of logic high output from the second AND gate based on the fourth signal corresponding to logic high.

In an embodiment, the PAM may further include a coupler connecting the antenna and the antenna selection module, and the coupler may be configured to provide a feedback signal of the transmitting signal transmitted via the antenna to the at least one processor.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device, comprising:
an antenna;
a power amplifier module (PAM) connected to the antenna, and including a power amplifier (PA) configured to amplify a transmitting signal for being transmitted to an external electronic device, and a protection circuit;
a power management integrated circuit (PMIC) configured to supply voltage to the PA; and
at least one processor, wherein the at least one processor is configured to:
via a comparator in the protection circuit, provide a first signal, to a NAND gate in the protection circuit, in response to identifying that the supply voltage provided from the PMIC to the PA reaches to a target voltage corresponding to a transmitting voltage of the transmitting signal
via the NAND gate, provide, to a AND gate in the protection circuit, a second signal indicating a result of a logical operation between the first signal and a bias enable signal for the PA,
via a peak detector in the protection circuit, provide, to the AND gate, a third signal indicating whether the transmitting signal is input to the PAM,
via the AND gate, provide, to a switching circuit, a fourth signal indicating a result of logical operation between the second signal and the third signal,
via the switching circuit in the protection circuit, identify whether to apply a bias voltage to the PA, based on the fourth signal, and
using the PA to which the bias voltage is applied, transmit the transmitting signal, to the external electronic device, via the antenna.

2. The electronic device of claim 1,
wherein the at least one processor is configured to transmit the transmitting signal, to the external electronic device, via a transmitting filter of a duplexer.

3. The electronic device of claim 2,
wherein the PAM includes an impedance matching circuit connecting the PA and the duplexer, and
wherein the impedance matching circuit includes at least one variable capacitor and at least one inductor configured to match between an output impedance of the PA and an input impedance of the duplexer.

4. The electronic device of claim 1,
wherein the PAM further includes a low drop out (LDO), configured to convert a power supply voltage value to the target voltage, and to provide the target voltage, to the comparator in the protection circuit.

5. The electronic device of claim 1,
wherein the second signal, generated from the NAND gate in the protection circuit, corresponds to logic low, based on the bias enable signal corresponding to logic low,
wherein the fourth signal, generated from the AND gate in the protection circuit, corresponds to logic low, independently from a logic value of the third signal, and
wherein the switching circuit in the protection circuit is configured to bypass providing of the bias voltage to the PA.

6. The electronic device of claim 1,
based on the third signal indicating whether the transmitting signal is input to the PAM corresponding to logic low, the fourth signal generated from the AND gate in the protection circuit, corresponds to logic low, independently from a logic value of the second signal, and
wherein the switching circuit in the protection circuit, is configured to bypass providing of the bias voltage to the PA.

7. The electronic device of claim 1, wherein the switching circuit includes PMOS transistor and NMOS transistor
wherein a source node of the PMOS transistor is connected to a node providing the bias voltage, and
wherein a source node of the NMOS transistor is connected to a ground node.

8. The electronic device of claim 7, wherein the switching circuit is configured to:
based on the fourth signal corresponding to logic low, connect the node providing the bias voltage and a base node of the PA by turning on the PMOS transistor and turning off the NMOS transistor, and
based on the fourth signal corresponding to logic high, connect the ground node and the base node, by turning off the PMOS transistor, and turning on the NMOS transistor.

9. The electronic device of claim 4, wherein the PAM further includes a controller configured to generate the bias enable signal and indicate a value of the target voltage to the LDO.

10. An electronic device, comprising:
an antenna;
a power amplifier module (PAM) connected to the antenna, and including a driving amplifier (DA) and a power amplifier (PA) configured to amplify a transmitting signal for being transmitted to an external electronic device, and a protection circuit;
a power management integrated circuit (PMIC) configured to supply voltage to the DA and the PA; and
at least one processor, wherein the at least one processor is configured to:
via a comparator in the protection circuit, provide a first signal, to a first AND gate in the protection circuit, in response to identifying that the supply voltage provided from the PMIC to the DA and the PA reaches to a target voltage corresponding to a transmitting voltage of the transmitting signal
via the first AND gate, provide, to a NAND gate in the protection circuit, a second signal indicating a result of a logical operation between the first signal and at least one enable signal for selecting a frequency band of the transmitting signal,
via the NAND gate, provide, to a second AND gate in the protection circuit, a third signal indicating a result of a logical operation between the second signal and a bias enable signal for the DA and the PA,
via a peak detector in the protection circuit, provide, to the second AND gate, a fourth signal indicating whether the transmitting signal is input to the PAM,
via the second AND gate, provide, to a switching circuit, a fifth signal indicating a result of logical operation between the third signal and the fourth signal,
via the switching circuit in the protection circuit, identify whether to apply a bias voltage to the DA, based on the fifth signal, and
using the DA and the PA to which the bias voltage is applied, transmit the transmitting signal, to the external electronic device, via the antenna.

11. The electronic device of claim 10, wherein the PAM further includes:

a plurality of band pass filters configured to select any one of a plurality of frequency bands where the transmitting signal is delivered, a band selection switch connected between an output end of the PA and the plurality of band pass filter, and an antenna selection module comprising circuitry configured to connect between the antenna and the plurality of band pass filters.

12. The electronic device of claim 11, wherein the PAM further includes an impedance matching circuit configured to connect between the PA and the band selection switch, and wherein the impedance matching circuit includes at least one variable capacitor and at least one inductor configured to match between an output impedance of the PA and an input impedance of the band selection switch.

13. The electronic device of claim 10, wherein the PAM further includes a low drop out (LDO) configured to convert a power supply voltage value to the target voltage, and to provide the target voltage, to the comparator in the protection circuit.

14. The electronic device of claim 10, based on the at least one enable signal for selecting a frequency band of the transmitting signal corresponding to logic low, the second signal being generated from the first AND gate in the protection circuit, corresponds to logic low, and wherein the third signal generated from the NAND gate in the protection circuit, corresponds to logic high, independently from a logic value of the second signal.

15. The electronic device of claim 14, based on the fourth signal corresponding to logic high, the fifth signal generated from the second AND gate in the protection circuit, corresponds to logic high, and wherein the switching circuit in the protection circuit is configured to bypass providing the bias voltage to the DA.

16. The electronic device of claim 10, when the bias enable signal corresponds to logic low, wherein the third signal being generated from the NAND gate in the protection circuit, corresponds to logic high, independently from the second signal.

17. The electronic device of claim 16, based on the fourth signal corresponding to logic high, the fifth signal generated from the second AND gate in the protection circuit, corresponds to logic high, and wherein the switching circuit in the protection circuit is configured to bypass providing the bias voltage to the DA.

18. The electronic device of claim 10, wherein the switching circuit includes PMOS transistor and NMOS transistor, wherein a source node of the PMOS transistor is connected to a node providing the bias voltage, and wherein a source node of the NMOS transistor is connected to a ground node.

19. The electronic device of claim 18, wherein the switching circuit is configured to:

based on the fifth signal corresponding to logic low, connect between a base node of the DA and the node providing the bias voltage, by turning on the PMOS transistor and turning off the NMOS transistor, and based on the fifth signal corresponding to a logic high, connect between the base node of the DA and the ground node, by turning off the PMOS transistor and turning on the NMOS transistor.

20. The electronic device of claim 13, wherein the PAM further includes a controller configured to: generate the bias enable signal and the at least one enable signal for selecting a frequency band of the transmitting signal, and indicate a value of the target voltage to the LDO.

* * * * *